(12) United States Patent
Nakamura

(10) Patent No.: US 7,643,520 B2
(45) Date of Patent: Jan. 5, 2010

(54) EXTERNAL CAVITY RESONATOR TYPE TUNABLE LIGHT SOURCE WHICH CAN BE EASILY MANUFACTURED AND WHICH IS CAPABLE OF WAVELENGTH SWEEPING AT HIGH SPEED

(75) Inventor: Kenichi Nakamura, Zama (JP)

(73) Assignee: Anritsu Corporation, Atsugi-Shi (JP)

( * ) Notice: Subject to any disclaimer, the term of this patent is extended or adjusted under 35 U.S.C. 154(b) by 98 days.

(21) Appl. No.: 12/077,398

(22) Filed: Mar. 19, 2008

(65) Prior Publication Data

US 2008/0175281 A1 Jul. 24, 2008

Related U.S. Application Data

(62) Division of application No. 11/086,858, filed on Mar. 21, 2005, now Pat. No. 7,496,118.

(30) Foreign Application Priority Data

Mar. 30, 2004 (JP) .............................. 2004-100240

(51) Int. Cl.
*H01S 3/10* (2006.01)

(52) U.S. Cl. ............................... 372/20; 372/9; 372/92; 372/99

(58) Field of Classification Search ..................... 372/9, 372/20, 92, 99
See application file for complete search history.

(56) References Cited

U.S. PATENT DOCUMENTS 5,319,668 A 6/1994 Luecke (Continued)

FOREIGN PATENT DOCUMENTS

EP 1 202 409 A1 5/2002

(Continued)

*Primary Examiner*—Minsun Harvey
*Assistant Examiner*—Yuanda Zhang
(74) *Attorney, Agent, or Firm*—Frishauf, Holtz, Goodman & Chick, P.C.

(57) ABSTRACT

A collimator lens converts light beams emitted from a low reflectance facet of a semiconductor laser into parallel light beams. A diffraction grating receives and diffracts the light beams at a predetermined incident position and a predetermined angle of a diffraction face. A turnable mirror has a mirror surface which is positioned opposite the diffractance facet of the diffraction grating, makes the diffracted light beams incident in a reverse optical path to the diffraction face, and returns the incident light beams to the laser. A stationary mirror makes the light beams from the collimator lens incident from a predetermined direction to a predetermined position of the diffraction grating at the side of the mirror surface of a virtual plane extending from the mirror surface of the mirror and at the side of the diffraction face of a virtual plane extending from the diffraction face of the diffraction grating.

13 Claims, 11 Drawing Sheets

U.S. PATENT DOCUMENTS

| | | |
|---|---|---|
| 5,594,744 A | 1/1997 | Lefevre et al. |
| 5,629,790 A | 5/1997 | Neukermans et al. |
| 6,463,085 B1 | 10/2002 | Tayebati |
| 6,887,396 B2 | 5/2005 | Tsuboi et al. |
| 7,031,353 B2 | 4/2006 | Clifford et al. |
| 7,075,693 B2 | 7/2006 | Ljungblad |
| 2002/0181537 A1 | 12/2002 | Mueller |
| 2003/0042801 A1 | 3/2003 | Miyajima et al. |
| 2004/0062281 A1 | 4/2004 | Trutna |
| 2004/0151214 A1 | 8/2004 | Syms |
| 2005/0134951 A1 | 6/2005 | Mi et al. |

FOREIGN PATENT DOCUMENTS

| | | |
|---|---|---|
| JP | 3069643 B2 | 5/2000 |
| JP | 2000-164981 A | 6/2000 |
| WO | WO 01/43241 A2 | 6/2001 |

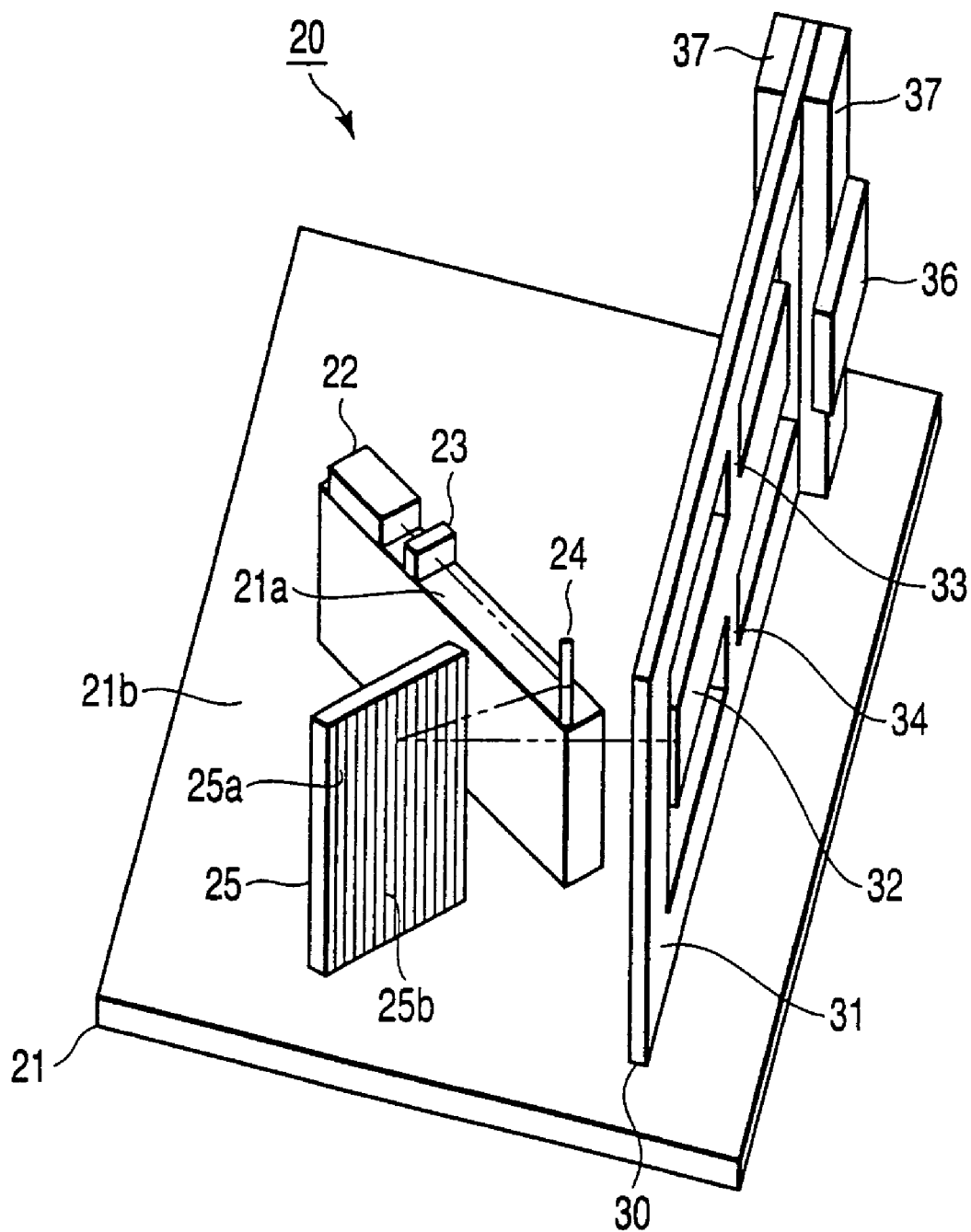
F I G. 1

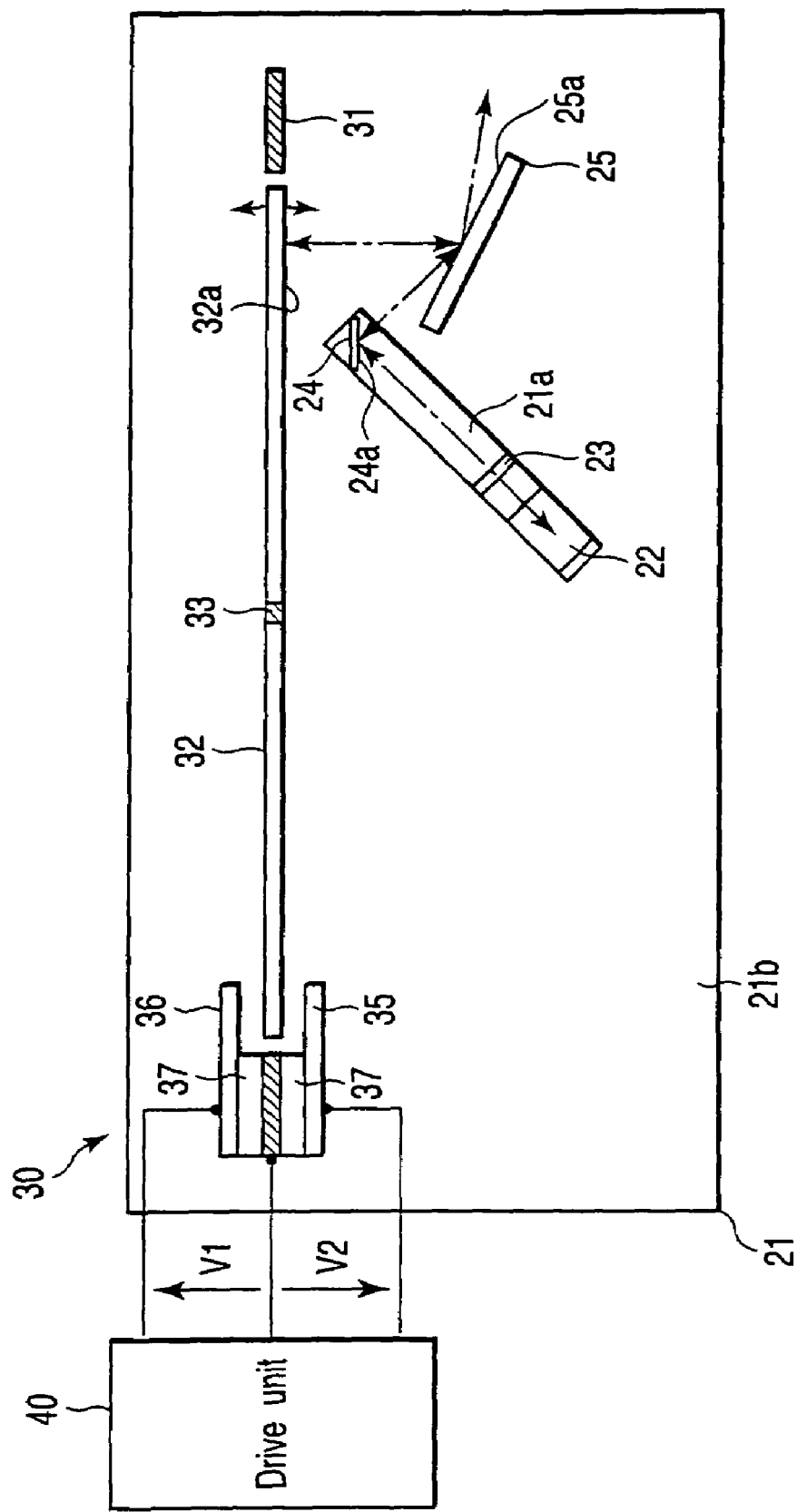
F I G. 2

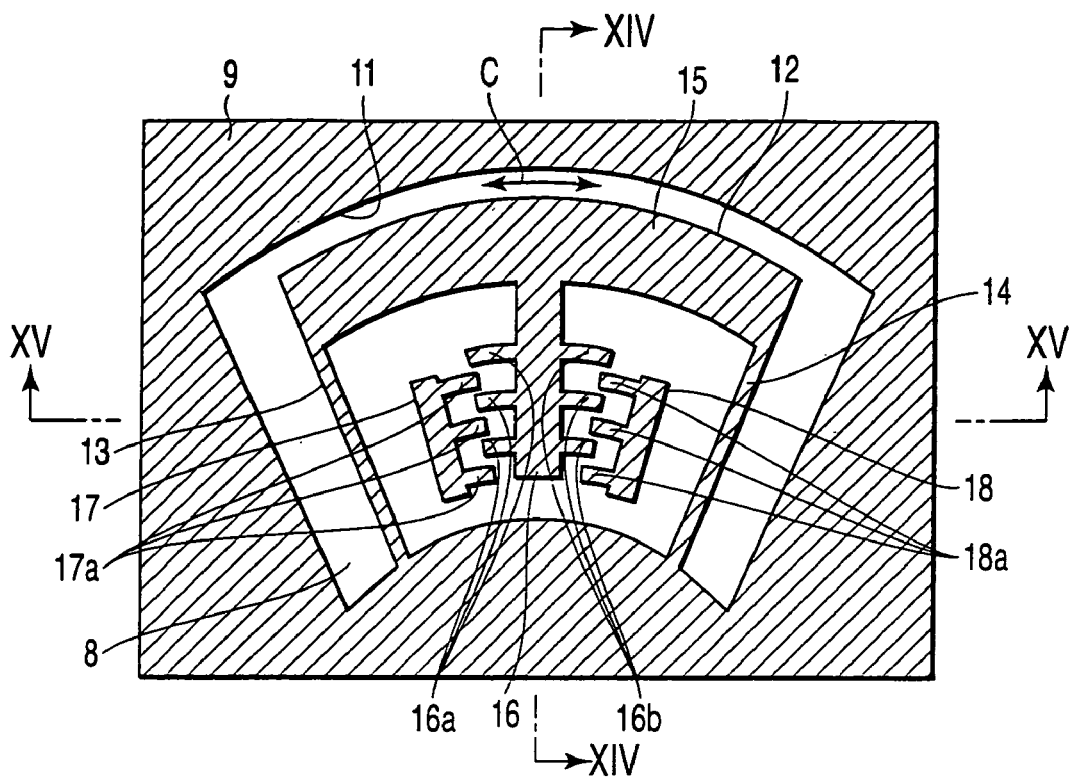
F I G. 1 3   PRIOR ART
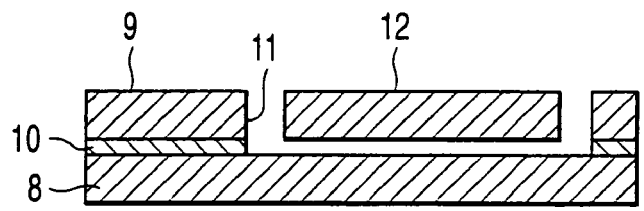
F I G. 1 4   PRIOR ART
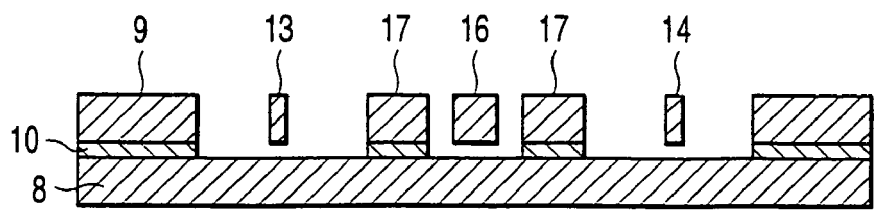
F I G. 1 5   PRIOR ART

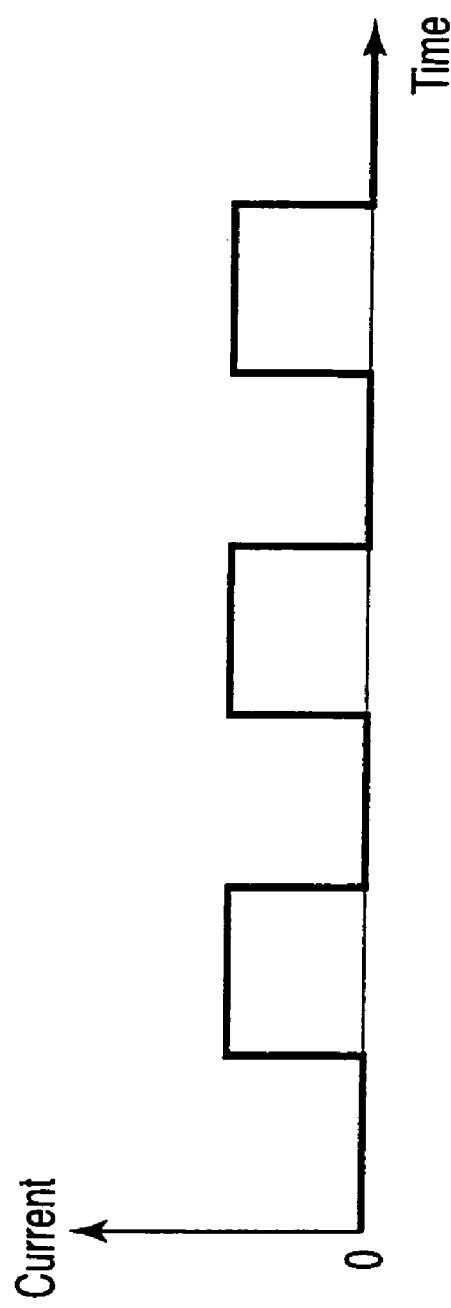
F I G. 18A
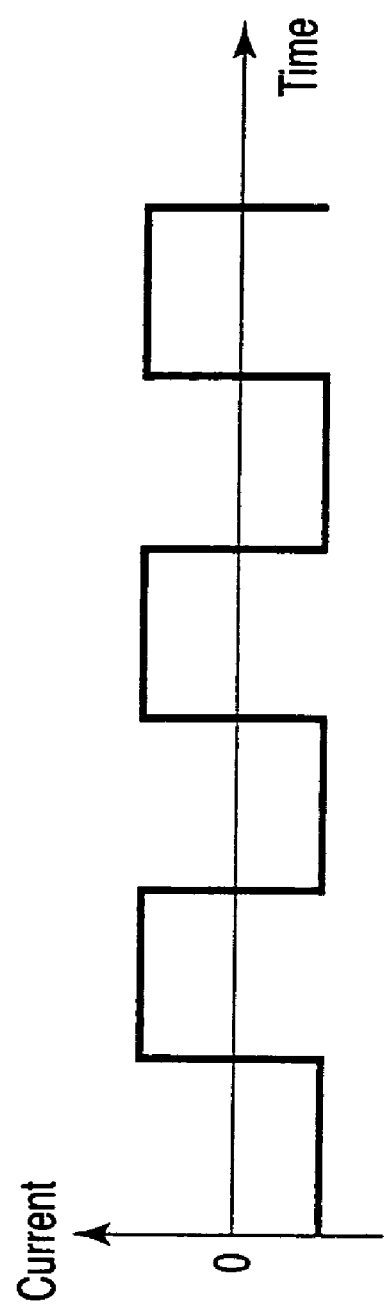
F I G. 18B

EXTERNAL CAVITY RESONATOR TYPE TUNABLE LIGHT SOURCE WHICH CAN BE EASILY MANUFACTURED AND WHICH IS CAPABLE OF WAVELENGTH SWEEPING AT HIGH SPEED

CROSS-REFERENCE TO RELATED APPLICATIONS

The present application is a Divisional Application of U.S. application Ser. No. 11/086,858, filed Mar. 21, 2005, now U.S. Pat. No. 7,496,118 which is based upon and claims the benefit of priority from prior Japanese Patent Application No. 2004-100240, filed Mar. 30, 2004, the entire contents of which are incorporated herein by reference.

BACKGROUND OF THE INVENTION

1. Field of the Invention

The present invention relates to an external cavity resonator type tunable light source, and more particularly, to an external cavity resonator type tunable light source which can be easily fabricated and which uses a technique enabling wavelength sweeping at a high speed.

2. Description of the Related Art

As is well known, a tunable light source is used for evaluating optical communication lines, optical communication devices and fiber brag grating (FBG) sensors.

As a tunable light source of this type, an external cavity resonator type tunable light source called a Littman type is known.

The external cavity resonator type tunable light source basically has a structure shown in FIG. 10.

A tunable light source 1 shown in FIG. 10 has the following structure. That is, the light emitted from a low reflectance facet in a semiconductor laser 2 to which an anti-reflection (AR) coating have been applied is converted into parallel light beams by a collimator lens 3. The converted parallel light beams are made incident to the side of a diffraction face 4a of a diffraction grating 4 for diffracting light. The diffraction light beams diffracted by the grating 4 relevant to the incident light beams are made incident to a mirror 5. The reflection lights reflected on the mirror surface are made incident again in a reverse optical path to the diffraction grating 4, and the diffracted light beams relevant to the reflected light beams are returned to the semiconductor laser 2. An external cavity is formed between another face of semiconductor laser 2 and the reflection face.

In the tunable light source with this structure, among wavelength components of the light beams diffracted by the diffraction face 4a after being emitted from the semiconductor laser 2, only a specific wavelength perpendicular to the mirror surface 5a and its proximal wavelength components are returned to the semiconductor laser 2.

The semiconductor laser 2 amplifies the returned light having a specific wavelength to produce a standing wave in the external cavity, and emits a light beam having its specific wavelength (referred to as an external cavity resonator wavelength).

The external cavity resonator wavelength is specified by both of an angle formed between the diffraction face 4a and the mirror surface 5a and an optical path length reaching the mirror 5 from the semiconductor laser 2 through the diffraction grating 4. Thus, an angle (or distance) of the mirror surface 5a with respect to the diffraction face 4a is changed, thereby making it possible to change its resonance wavelength.

Then, a plane H1 extending the face 4a of the diffraction grating 4, a plane H2 extending an effective end facet of the resonator (end face considering a refractive index of the semiconductor laser 2 and the collimator-lens 3), and a plane H3 extending the mirror surface 5a cross one another at an identical position O, and the mirror 5 is rotated in a direction indicated by the arrow A around the position O, whereby the external cavity resonator type tunable light source can vary a resonance wavelength continuously.

In the case where the external cavity resonator type tunable light source having such a basic structure is actually provided in a variety of devices, it is necessary to support the mirror 5. In addition, since a support member for making a turning operation around the predetermined position O crosses an optical path going from the semiconductor laser 2 to the diffraction grating 4, it is necessary to configure the support member so as not to block the optical path.

In an example of a structure of the support member, according to a first prior art, as shown in FIG. 11, the support member is turnably supported at the one end side, in a direction indicated by the arrow B, and, at the other end side, a light transmission hole (or a cutout portion) 6a is provided at an intermediate portion of an arm shaped support body 6 for supporting the mirror 5. The emitted light of the semiconductor 2 or the light from the collimator lens 3 is passed through the hole 6a.

The above-described example of the structure of supporting the mirror 5 by the support member 6 according to the first prior art is disclosed in patent document 1 (U.S. Pat. No. 5,319,668).

In addition, as a support member for supporting and turning a mirror without blocking an optical path, according to a second prior art, there is known a support member for turning a mirror 5 in a state in which the mirror is vertically stood on a movable section 12 which is formed using a flat wafer 7 and which is turnable along the one face thereof, as shown in FIGS. 12 to 16.

The wafer 7 called as SOI (silicon on insulator) wafer which consists of two silicon substrates 8, 9 and an insulation film ($SiO_2$) 10 as shown in FIG. 12, and movable section 12 is made by etching process for the upper substrate 9.

A fan shaped hole 11 is formed in the upper substrate 9, and, a fan shaped movable section 12 formed in the fan shaped hole 11 is formed inside the hole. An insulation film 10 at a bottom face of the hole 11 is removed by etching, and a surface of the lower substrate 8 is exposed.

The movable section 12 has: two plate spring portions 13, 14 extend in a small width from a narrower arc shaped edge part of the hole 11 to a wider edge part thereof, and which can be bent in a plane parallel to the lower substrate 8 and orthogonal to its lengthwise direction; a wider disk plate 15 connecting the tip ends of the plate springs 13, 14 in an arc shape; and an electrode portion 16 which extends from an inner edge of the disk plate 15 toward a narrower arc shape edge part of the hole 11. On both sides of the electrode portion 16, combs 16a, 16b are protruded in an arc shape at predetermined intervals.

The movable section 12, as shown in FIGS. 14 and 15, is supported in a state in which it is slightly floated from a top face of the lower substrate 8. The disk plate 15 and the electrode portion 16 of the movable section 12 can be turned in a direction indicated by the arrow C on a face parallel to a top face of the lower substrate 8 inside of the hole 11 by lateral bending of the plate spring portions 13, 14.

In addition, stationary electrodes 17, 18 are allocated, respectively, between the plate spring portion 13 and the electrode 16 and between the plate spring 14 and the electrode 16.

The stationary electrodes 17, 18 are fixed onto the lower substrate 8 via the insulation layer 10 while these electrodes are insulated from the upper substrate 9. The electrodes have arc shaped combs 17a, 18a formed so as to be mated in a state in which a gap is provided to each of the combs 16a, 16b of the electrode portion 16 of the movable section 12.

Although the mirror 5 rotating mechanism fabricated in the wafer 7 shown in FIGS. 12 to 15 is shown as having the simplest structure, a plurality of electrode portions 16 may be provided, and the stationary electrodes 17, 18 may be provided for each of the electrode portions.

In the case of the thus configured mirror rotating mechanism, for example, as shown in FIG. 16, when a predetermined voltage V is applied between the movable section 12 and the stationary electrode 17, an electric field is generated between the comb 17a of the stationary electrode 17 and the comb 16a of the electrode portion 16 of the movable section 12. Then, an electrostatic force in an attractive direction is generated between the combs, and the electrode portion 16 is attracted to the side of the stationary electrode 17. Then, the whole movable section 12 turns in a counterclockwise direction (indicated by the arrow D) shown in FIG. 16, and stops at a position at which the attractive force and the reaction of the plate spring portions 13, 14 are well equilibrated.

The stop position of the movable section 12 can be arbitrary varied in a predetermined range by varying the applied voltage V.

Therefore, as shown in FIG. 12, the mirror 5 is fixed onto the movable section 12 in a vertically stood state, whereby an angle of the mirror 5 with respect to the diffraction grating 4 can be varied in a predetermined range without interfering an optical path from the semiconductor laser 2 to the diffraction grating 4, and a wavelength of the light beam emitted from the semiconductor laser 2 can be varied with a downsized construction.

The structure of the movable section 12 for supporting the mirror 5 in a state in which the mirror is stood, according to the second prior art, is disclosed in, for example, patent document 2 (Brochure of International Patent Application Publication No. 01/43241).

However, the support member 6 according to the first prior art disclosed in the above patent document 1 requires a light transmission hole 6a at its intermediate portion, and is structurally complicated. In addition, the structure is prone to be lower in strength, and is easily deformed as compared with a hole free structure, thus making it difficult to vary a wavelength at a high speed.

Further, the movable section 12 fabricated in the wafer 7 according to the second prior art disclosed in the above patent document 2 has a four-point link structure in which both ends of the two plate spring portions 13, 14 are defined as fulcrums. Thus, strictly, the turning center is not constant, and the turning center is displaced more remarkably as the variable angle is increased.

In order to eliminate this displacement of the turning center, it is necessary to make complicated position control relevant to the movable section 12, making it difficult to vary a wavelength at a high speed. In addition, in order to make such complicated control, it is necessary to further make position control of the movable section 12 by using a complicated electrode structure or to make posture control at the diffraction grating side, thus further making the structure complicated.

Moreover, the mirror 5 must be fixed precisely vertically on the movable section 12 of the support member 7, and the fixing work becomes very complicated.

BRIEF SUMMARY OF THE INVENTION

The present invention has been achieved to solve the above described problems associated with the prior arts. It is an object of the present invention to provide an external cavity resonator type tunable light source which can be easily manufactured and which can vary a wavelength at a high speed by simplifying a mirror support structure.

In order to achieve the above object, according to a first aspect of the present invention, there is provided an external cavity resonator type tunable light source (20) comprising:

a semiconductor laser (22), at least one light emission facet of which has low reflectance facet;

a collimator lens (23) which converts light emitted from the low reflectance facet of the semiconductor laser into parallel light beams;

a diffraction grating (25) which receives and diffracts the light beams from the collimator lens at a predetermined incident position on and at a predetermined incident angle to a diffraction face (25a) on which a diffraction groove (25b) is provided; and a turnable mirror (30) which has a mirror surface positioned to be opposed to the diffraction face of the diffraction grating, the mirror surface being adopted to receive diffracted light beams from the diffraction grating, make the received light beams incident to the diffraction face of the diffraction grating again in a reverse optical path, and return the incident light beams to the semiconductor laser, and which is formed so as to enable the reflection face to be reciprocally turned at a predetermined angle range and around an axis defined as a turning center, which is parallel to the diffraction groove and is on a plane extending the diffraction face of the diffraction grating wherein a resonator length (L1+L5) determined depending on an optical path length from an effective end facet of the resonator to the turnable mirror surface via the diffraction grating is changed by turning of the turnable mirror surface to sweep a wavelength of the emitted light beams of the semiconductor laser; and a stationary mirror (24) allocated so as to make light beams emitted from the semiconductor laser via the collimator lens incident from a predetermined direction to a predetermined position of the diffraction grating at the side of the mirror surface of a virtual plane extending the mirror surface of the turnable mirror surface and at the side of the diffraction face of a virtual plane extending the diffraction face of the diffraction grating, wherein the semiconductor laser and the collimator lens are allocated at the side of the mirror surface of a virtual plane extending the turnable mirror surface, and an optical path length (L1+L5) from the effective end facet of the resonator to the collimator lens, the stationary mirror, the predetermined position of the diffraction grating, and the turnable mirror surface is substantially equal to the resonator length (L3+L4+L5).

In order to achieve the above object, according to a second aspect of the present invention, there is provided an external cavity resonator type tunable light source according to the first aspect, wherein the turnable mirror comprises:

a frame (31);

a reflection plate (32) which is allocated inside of the frame and which has the mirror surface formed at least at one face side thereof;

a pair of link sections (33, 34) which extend so as to be arranged on one straight line from edge portions opposed to each other, of the frame, to outer edges of the reflection plate to link between the frame and the reflection plate, the link sections enabling torsional deformation along a lengthwise direction thereof; and drive means (35, 36, 40) for applying an external force to the reflection plate to cause the reflection plate to turn in the predetermined angle range around a line connecting centers of the pair of link sections defined as the turning center.

In order to achieve the above object, according to a third aspect of the present invention, there is provided an external cavity resonator type tunable light source according to the second aspect, wherein the drive means apply an external force in a cycle which corresponds to a resonance frequency of the reflection plate of the turnable mirror to cause the reflection plate to be reciprocated at the resonance frequency.

In order to achieve the above object, according to a fourth aspect of the present invention, there is provided an external cavity resonator type tunable light source according to the first aspect, wherein a relationship r=(L3+L4−L2)/sin α is established among: a distance "r" from the turning center to the predetermined incidence position of the diffraction face of the diffraction grating; a distance L2 from the turning center to the plane extending the mirror surface; an optical path length L3 from the effective end facet of the resonator to the stationary mirror; an optical path length L4 from the stationary mirror to the predetermined incident position of the diffraction face of the diffraction grating; and a light incidence angle α from the stationary mirror to the diffraction face of the diffraction grating.

In order to achieve the above object, according to a fifth aspect of the present invention, there is provided an external cavity resonator type tunable light source according to the first aspect, wherein the turnable mirror comprises:

a frame (31) formed of an electrically conductive substrate, and formed of a top plate (31a), a bottom plate (31b), and a pair of side plates (31c, 31d) in a transversely rectangular frame shape;

a transversely rectangular shaped reflection plate (32) which is allocated concentrically inside of the frame, and which has formed thereon a mirror surface (32a) for reflecting light beams at least at one face side thereof;

a pair of link sections (33, 34) which extend so as to be vertically arranged on one straight line from inner edge centers opposed to each other, of the top plate and the bottom plate of the frame to an upper edge center and a lower edge center of the reflection plate to link between the top plate or the lower plate of the frame and the reflection plate, the link sections being torsionally deformed to turn the reflection plate; and drive means (35, 36, 40) for applying an external force to the reflection plate to cause the reflection plate to turn in the predetermined angle range around a line connecting centers of the pair of link sections defined as the turning center.

In order to achieve the above object, according to a sixth aspect of the present invention, there is provided an external cavity resonator type tunable light source according to the fifth aspect, wherein the substrate is a silicon substrate.

In order to achieve the above object, according to a seventh aspect of the present invention, there is provided an external cavity resonator type tunable light source according to the fifth aspect, wherein the drive means include means for generating an electrostatic driving force as an external force applied to the reflection plate.

In order to achieve the above object, according to an eighth aspect of the present invention, there is provided an external cavity resonator type tunable light source according to the fifth aspect, wherein the drive means each include two electrode plates (35, 36) mounted via an insulating spacer (37) on one or both of a pair of side plates of the frame in order to apply an external force to the reflection plate in an electrostatic manner.

In order to achieve the above object, according to a ninth aspect of the present invention, there is provided an external cavity resonator type tunable light source according to the eighth aspect, wherein the drive means each include means for applying signals V1, V2 whose phase are shifted by 180 degrees each other with respect to the two electrode plates while the frame is defined as a reference electric potential, and alternately generating an electrostatic attractive force between the two electrode plates and the end portion of the reflection plate, thereby causing the reflection plate to reciprocally turn.

In order to achieve the above object, according to a tenth aspect of the present invention, there is provided an external cavity resonator type tunable light source according to the ninth aspect, wherein a frequency of the signals V1, V2 is set so as to be substantially equal to the resonance frequency of the reflection plate which is mainly determined depending on a shape or a weight of the reflection plate of the turnable mirror and a torsional spring constant of the pair of link sections.

In order to achieve the above object, according to an eleventh aspect of the present invention, there is provided an external cavity resonator type tunable light source according to the fifth aspect, wherein the drive means each include means for electromagnetically applying an external force as an external force applied to the reflection plate.

In order to achieve the above object, according to a twelfth aspect of the present invention, there is provided an external cavity resonator type tunable light source according to the eleventh aspect, wherein the means for electromagnetically applying an external force each include a combination of a magnetic plate (51) fixed to the reflection plate and a coil (52) which acts an electromagnetic force to the magnetic plate.

In order to achieve the above object, according to a thirteenth aspect of the present invention, there is provided an external cavity resonator type tunable light source according to the eleventh aspect, wherein the means for electromagnetically applying an external force each include a combination of a magnet (51) fixed to the reflection plate and a coil (52) which acts an electromagnetical force to the magnet.

In order to achieve the above object, according to a fourteenth aspect of the present invention, there is provided an external cavity resonator type tunable light source according to the twelfth aspect, wherein the drive means each include means for applying a half wave current in a cycle which is substantially equal to the resonance frequency of the reflection plate to the coil.

In order to achieve the above object, according to a fifteenth aspect of the present invention, there is provided an external cavity resonator type tunable light source according to the thirteenth aspect, wherein the drive means each include means for applying a full wave current in a cycle which is substantially equal to the resonance frequency of the reflection plate to the coil.

In order to achieve the above object, according to a sixteenth aspect of the present invention, there is provided an external cavity resonator type tunable light source according to the first aspect, wherein a configuration is provided so that the stationary mirror surface (24a) is in parallel to the diffraction groove of the diffraction grating and an optical path from the semiconductor laser to the reflection plate through the collimator lens, the stationary mirror, and the diffraction grating is on an identical plane.

In order to achieve the above object, according to a seventeenth aspect of the present invention, there is provided an external cavity resonator type tunable light source according to the second aspect, wherein the semiconductor laser and the collimator lens are allocated at an arbitrary position in a space in which the diffraction grating is included, from among two spaces partitioned by a plane extending the reflection face (32a) of the reflection plate, and a direction of the stationary mirror surface (24a) is set in accordance with the allocation position of the semiconductor laser and the collimator lens.

In order to achieve the above object, according to an eighteenth aspect of the present invention, there is provided an external cavity resonator type tunable light source according to the seventeenth aspect, wherein the semiconductor laser, the collimator lens and the stationary mirror are supported by a support member (41) after being allocated to be vertically arranged with respect to a base (21) so that optical axes thereof are parallel to the diffraction groove of the diffraction grating, light beams from the collimator lens are received on the stationary mirror surface which forms an angle of 45 degrees with respect to a top face of the base, and the received light beams are made incident to the diffraction face of the diffraction grating.

In order to achieve the above object, according to a nineteenth aspect of the present invention, there is provided an external cavity resonator type tunable light source according to the second aspect, wherein the frame of the turnable mirror is supported by a pair of support members (51, 52) stood at both ends of the top part of a flat base (50); the diffraction grating is supported by another support member (53) stood on the top part of the substrate; the semiconductor laser, the collimator lens, and the stationary mirror are supported by a still another support member (54) stood in the vicinity of the another support member.

In order to achieve the above object, according to a twentieth aspect of the present invention, there is provided an external cavity resonator type tunable light source according to the nineteenth aspect, wherein, also at the other end side of the reflection plate, another semiconductor laser, another collimator lens, and another stationary mirror are supported by the another support members and the still another support member, thereby providing a configuration such that wavelength variable light beams can be emitted in a dual system manner.

In order to achieve the above object, according to a twenty-first aspect of the present invention, there is provided an external cavity resonator type tunable light source according to the second aspect, wherein the reflection plate is formed symmetrically on the left and right with respect to the pair of link sections, one end side of which is used as a light reflecting section, and the other end side is adopted to receive an external force.

In order to achieve the above object, according to a twenty-second aspect of the present invention, there is provided an external cavity resonator type tunable light source according to the second aspect, wherein the reflection plate of the turnable mirror reduces a length in a transverse direction at the other end side and increase a width corresponding to a length in a vertical direction thereof to ensure that left and right rotation moments are well balanced.

In order to achieve the above object, according to a twenty-third aspect of the present invention, there is provided an external cavity resonator type tunable light source according to the second aspect, wherein the drive means include means for generating an electrostatic driving force as an external force applied to the reflection plate.

In order to achieve the above object, according to a twenty-fourth aspect of the present invention, there is provided an external cavity resonator type tunable light source according to the second aspect, wherein the drive means each include two electrode plates mounted via an insulating spacer on one or both of a pair of side plates of the frame in order to apply an external force to the reflection plate in an electrostatic manner.

In order to achieve the above object, according to a twenty-fifth aspect of the present invention, there is provided an external cavity resonator type tunable light source according to the twenty-fourth aspect, wherein the drive means each include means for applying signals V1, V2 whose phase are shifted by 180 degrees each other with respect to the two electrode plates while the frame is defined as a reference electric potential, and alternately generating an electrostatic attractive force between the two electrode plates and the end portion of the reflection plate, thereby causing the reflection plate to reciprocally turn.

In order to achieve the above object, according to a twenty-sixth aspect of the present invention, there is provided an external cavity resonator type tunable light source according to the twenty-fifth aspect, wherein a frequency of the signals V1, V2 is set so as to be substantially equal to the resonance frequency vibrations of the reflection plate which is mainly determined depending on a shape or a weight of the reflection plate of the turnable mirror and a torsional spring constant of the pair of link sections.

In order to achieve the above object, according to a twenty-seventh aspect of the present invention, there is provided an external cavity resonator type tunable light source according to the second aspect, wherein the drive means each include means for electromagnetically applying an external force as an external force applied to the reflection plate.

In order to achieve the above object, according to a twenty-eighth aspect of the present invention, there is provided an external cavity resonator type tunable light source according to the twenty-seventh aspect, wherein the means for electromagnetically applying an external force each include a combination of a magnetic plate fixed to the reflection plate and a coil which acts an electromagnetic force to the magnetic plate.

In order to achieve the above object, according to a twenty-ninth aspect of the present invention, there is provided an external cavity resonator type tunable light source according to the twenty-seventh aspect, wherein the means for electromagnetically applying an external force each include a combination of a magnet fixed to the reflection plate and a coil which acts an electromagnetical force to the magnet.

In order to achieve the above object, according to a thirtieth aspect of the present invention, there is provided an external cavity resonator type tunable light source according to the twenty-eighth aspect, wherein the drive means each include means for applying a half wave current in a cycle which is substantially equal to the number of resonance frequency of the reflection plate to the coil.

In order to achieve the above object, according to a thirty-first aspect of the present invention, there is provided an external cavity resonator type tunable light source according to the twenty-ninth aspect, wherein the drive means each include means for applying a full wave current in a cycle which is substantially equal to the resonance frequency of the reflection plate to the coil.

In order to achieve the above object, according to a thirty-second aspect of the present invention, there is provided an external cavity resonator type tunable light source according to the second aspect, wherein the diffraction grating and the tunable mirror are structured to be stood on a base.

As has been described above, in an external cavity resonator type tunable light source, there is provided a structure in which: from among two spaces partitioned on a plane which extends a turnable mirror surface, a semiconductor laser and a collimator lens are allocated in a space in which a diffraction grating is included; an emitted light beam is received a stationary mirror allocated in a space sandwiched between the plane extending the turnable mirror surface and a plane extending a diffraction face of the diffraction grating toward a turning center and between a predetermined incident position and the turning center; the received light beams thereof are made incident to a predetermined incident position on the diffraction face of the diffraction grating; and the turnable mirror and an optical path do not cross each other.

Therefore, the external cavity resonator type tunable light source according to the present invention can simplify a construction of a turnable mirror and facilitate a mirror support structure, whereby the light source can be easily manufactured and is compatible with fast wavelength sweeping.

Further, in the external cavity resonator type tunable light source according to the present invention, as described previously, the turnable mirror does not cross the optical path. Thus, there can be provided a very simple structure in which the turnable mirror is linked between a frame and a reflection plate allocated inside of the frame via a pair of link sections at which a torsional deformation can occur along a lengthwise direction; an external force is provided to the reflection plate; the reflection plate is turned around a turning center connecting a center of the pair of link sections, enabling fast wavelength sweeping.

Furthermore, the external cavity resonator type tunable light source according to the present invention applies an external force at a cycle corresponding to the resonance frequency of the reflection plate of the turnable mirror. When the reflection plate is reciprocated at its resonance frequency, the reflection plate can be reciprocally turned with a small amount of driving energy, and wavelength sweeping can be carried out at a high speed.

Moreover, in the external cavity resonator type tunable light source according to the present invention, a relationship $r=(L3+L4-L2)/\sin\alpha$ is established among: a distance "r" from the turning center to the predetermined incidence position of the diffraction face of the diffraction grating; a distance L2 from the turning center to the plane extending the reflection face; an optical path length L3 from the effective end facet of the resonator to the stationary mirror; an optical path length L4 from the stationary mirror to the predetermined incident position of the diffraction face of the diffraction grating; and a light incidence angle $\alpha$ from the stationary mirror to the diffraction face of the diffraction grating. Thus, the emission wavelength can be continuously swept without mode hopping.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a perspective view showing a construction of one embodiment of an external cavity resonator type tunable light source according to the present invention;

FIG. 2 is a plan view showing the construction of the external cavity resonator type tunable light source shown in FIG. 1;

FIG. 13 is a plan view of the essential portions of the external cavity resonator type tunable light source according the second prior art;

FIG. 14 is a sectional view taken along the line XIV-XIV of FIG. 13;

FIG. 15 is a sectional view taken along the line XV-XV of FIG. 13;

FIGS. 18A and 18B are views each showing a drive signal of the external cavity resonator type tunable light source in FIG. 17.

DETAILED DESCRIPTION OF THE INVENTION

Figure 3:
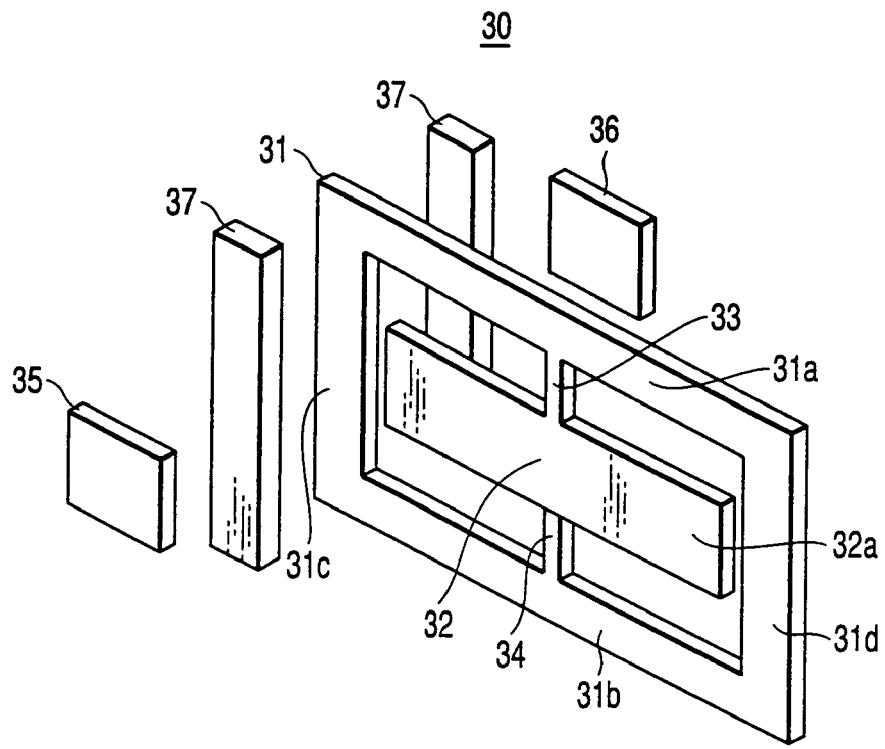
FIG. 3 is an exploded perspective view of essential portions showing the construction of the external cavity resonator type tunable light source shown in FIG. 1.

Reference will now be made in detail to the embodiments of the invention as illustrated in the accompanying drawings, in which like reference numerals designate like or corresponding parts.

Hereinafter, one embodiment of an external cavity resonator type tunable light source according to the present invention will be described with reference to the accompanying drawings.

Figure 5:
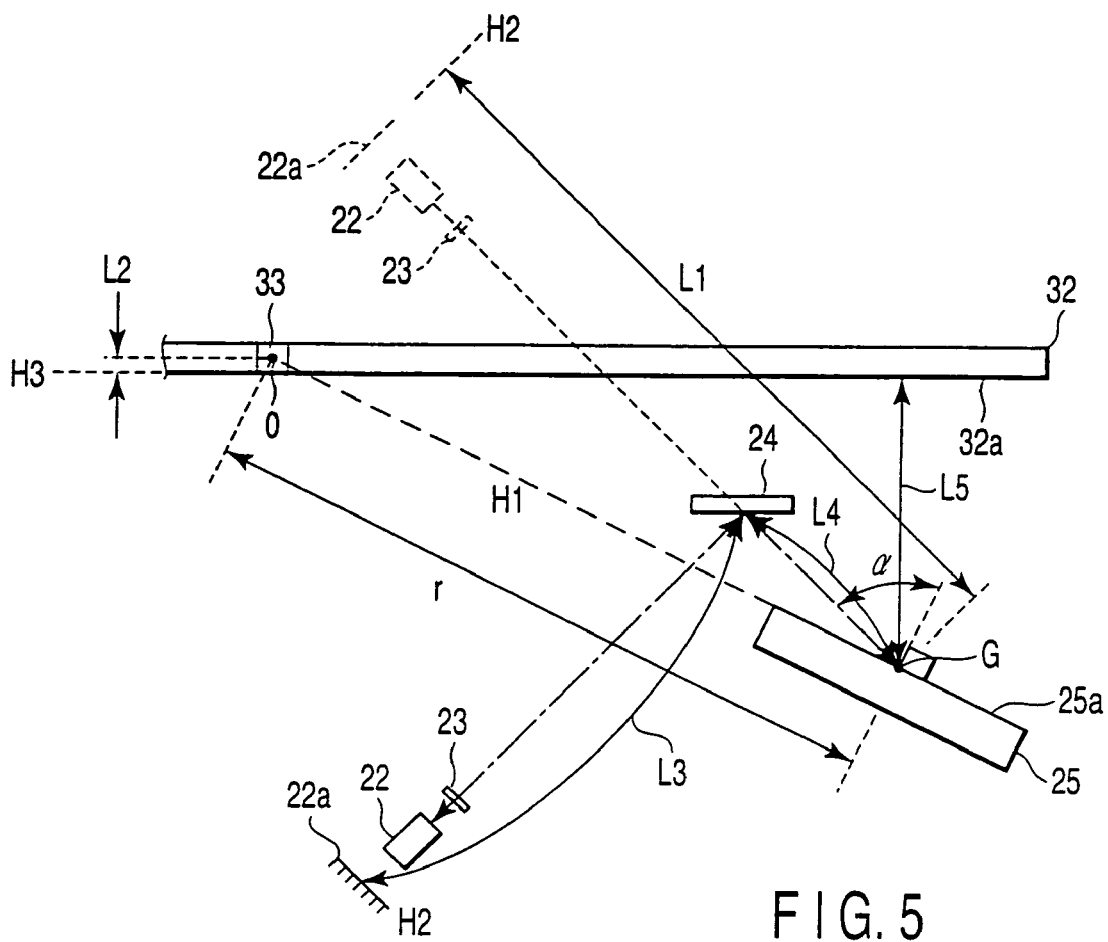
FIG. 5 is a view illustrating a condition for continuously sweeping a wavelength.

FIGS. 1 and 2 are a perspective view and a plan view each showing a whole construction of an external cavity resonator type tunable light source 20 according to one embodiment of the invention. FIG. 3 is an exploded perspective view showing a structure of essential portions of the light source. FIG. 5 is a plan view illustrating a condition for continuously sweeping a wavelength.

Basically, the external cavity resonator tunable light source 20 according to the invention, as shown in FIGS. 1, 2 and 5, has: a semiconductor laser 22 in which at least one light emission facet is a low reflectance facet; a collimator lens 23 for converting light emitted from the low reflectance facet of the semiconductor laser 22 into parallel light beams; a diffraction grating 25 for receiving the light beams from the collimator lens 23 at a predetermined incident position and a predetermined angle of a diffraction face 25a on which a diffraction groove 25b is provided and diffracting the received light beams; and a mirror surface 32a positioned to be opposed to the diffraction face 25a of the diffraction grating 25, the mirror surface being adopted to receive the diffracted light beams from the diffraction grating 25, make the diffraction light beams incident in a reverse optical path again on the diffraction face 25a of the diffraction grating 25, and return the incident light beams to the semiconductor laser 22. Further, the light source comprises: a turnable mirror 30 formed to be reciprocally turnable the mirror surface 32a in a predetermined angle range on a plane H1 extending the diffraction face 25a of the diffraction grating 25, an axis parallel to the diffraction groove 25b being a turning center; and a stationary mirror 24 allocated so as to make the light beams emitted from the semiconductor laser 22 via the collimator lens 23 incident from a predetermined direction to a predetermined position of the diffraction grating 25 at the side of mirror surface 32a of a virtual plane extending the mirror surface 32a of the turnable mirror 30 and at the side of the diffraction face 25a of a virtual plane extending the diffraction face 25a of the diffraction grating 25. The above light source is constructed as follows. That is, the semiconductor laser 22 and the collimator lens 23 are allocated at the side of the mirror surface 32a of a virtual plane extending the mirror surface 32a of the turnable mirror 30. An optical path length (L1+L5) from an effective end facet of the resonator to the turnable mirror surface 32a through the collimator lens 23, the stationary mirror 24 and the predetermined position of the diffraction grating 25 is substantially equal to a resonator length (L3+L4+L5) which is determined depending on an optical path length from the effective end facet of the resonator to the turnable mirror surface through the diffraction grating 25. The resonator length is changed by turning the turnable mirror surface 32a so as to sweep a wavelength of the emitted light of the semiconductor laser 22.

Specifically, the external cavity resonator type tunable light source 20 according to one embodiment of the invention, as shown in FIGS. 1 and 2, is constructed on a base 21 which has a high stage portion 21a and a low stage portion 21b whose top faces are parallel to each other. At the high stage portion 21a, there are fixed: a semiconductor laser 22 for emitting the light beams parallel to the top face of the low stage portion 21b from the (low reflectance facet); a collimator lens 23 for converting the light beams emitted from the semiconductor laser 22 into parallel light beams; and a stationary mirror 24 for receiving the parallel light beams from the collimator lens 23 on a mirror surface 24a vertical to the top face of the high stage portion 21a and reflecting the received light beams toward a diffraction face 25a of a diffraction grating 25 described later.

The reflection light beams of the stationary mirror 24 are made incident at a predetermined incidence angle α to a predetermined incident position of the diffraction face 25a of the diffraction grating 25 vertically stood at the low stage section 21b of the base 21.

On the diffraction face 25a of the diffraction grating 25, the diffraction groove 25b for diffracting light beams are provided in parallel in a direction vertical to the low stage portion 21b. The parallel light beams reflected on the stationary mirror 24 are diffracted in a direction according to a wavelength by means of the diffraction groove 25b of the diffraction face 25a.

The light beams diffracted on the diffraction grating 25 are made incident to the turnable mirror 30. The turnable mirror 30 has a mirror surface 32a for returning to the semiconductor laser 22 the diffracted light beams by the diffraction grating 25 to the parallel light beams made incident from the stationary mirror 24 by reflecting the light beams of the vertically inputted wavelength components onto the diffraction face 25a of the diffraction grating 25 in a reverse optical path.

An angle of the mirror surface 32a with respect to the diffraction face 25a of this diffraction grating 25 is periodically changed in a predetermined angle range. In this manner, the wavelength of the light returned to the semiconductor laser 22 in the reverse optical path by means of the reflection face 32a of the turnable mirror 30 continuously and periodically changes, whereby the wavelength of the light emitted from the tunable light source 20 also continuously and periodically changes.

The turnable mirror 30, as shown in FIGS. 1-3, has a frame 31, a reflection plate 32, and a pair of link sections 33, 34. The frame 31 is formed by etching processing or the like of an electrically conductive substrate (for example, a rectangle shaped single crystal silicon substrate having thickness of 0.1 mm, a horizontal length of 20 mm, and a vertical length of 10 mm to which micro electro mechanical systems (MEMS) are applied, and is formed of a top plate 31a, a bottom plate 31b, a side plate 31c, and a side plate 31d in a lengthwise rectangular frame shape. The reflection plate 32 is formed in a lengthwise rectangular shape having a horizontal length of 10 mm and a vertical length of 2 mm, for example, which is allocated or arranged in a concentric shape inside of the frame 31, the reflection plate 32 having formed thereon a mirror surface 32a for reflecting light beams on at least one face side. The pair of link sections 33, 34 have a width of 0.1 mm, for example, each of which extends from an inner edge center at which the top plate 31a, and the bottom plate 31b of the frame 31 are opposed to each other to the upper edge center and the lower edge center of the reflection plate 32 so as to be vertically arranged on a straight line. The link sections 33, 34 link between the top plate 31a or the bottom plate 31b and the reflection plate 32, and cause the reflection plate 32 to turn by a torsion deformation.

The mirror surface 32a of the reflection plate 32 can be formed, for example, by means of mirror face finishing relevant to the plate surface, vapor deposition of a metal film indicating a high reflection index, or of dielectric multi-layered film.

In addition, in the case where the turnable mirror 30 is made of a material indicating a high reflection index relevant to the laser light beams, the plate surface can be used as a mirror surface without providing a reflection film or a reflection sheet.

However, in the case where the turnable mirror 30 is not electrically conductive, it is necessary to vapor-depose an electrically conductive metal film as a material for the mirror in order to ensure an electrostatic driving force described later.

The width and length of the pair of link sections 33, 34 is set so that the link sections 33, 34 can be torsionally deformed in its lengthwise direction, and a reactance for returning its deformed state to its original state is generated themselves.

On both faces of one of a pair of side plates 31c, 31d (side plate 31c in this case) of the frame 31 of the turnable mirror 30, electrode plates 35, 36 for imparting an external force to the reflection plate 32 in an electrostatic manner each are mounted via a spacer 37 having insulation property.

The electrode plates 35, 36 overlap each other in a state a gap for the thickness of the spacer 37 is opened on both faces of one end side (left end side in this case) of the reflection plate 32.

Although the spacer 37 is formed in a vertically elongated rectangle shape, the spacer 37 may be formed in a rectangular frame shape overlapped with the frame 31 in order to ensure the reinforce of the entire frame 31.

The turnable mirror 30 is fixed onto the base 21 in a state in which the turning center of the reflection plate 32 (the line connecting the center of the link sections 33, 34) is on a plane extending the diffraction face 25a of the diffraction grating 25 and is in parallel to the diffraction groove 25b.

Although the turnable mirror 30 is formed in accordance with an etching process or the like of a silicon substrate to which the MEMS are applied, for example, as described previously, including the electrode plates 35, 36 and the spacer 37, its manufacturing method is arbitrary.

For example, the turnable mirror can be manufactured in accordance with a method of etching and forming the frame 31, the reflection plate 32 and the link sections 33, 34 of the turnable mirror 30 on a single-layered substrate; forming the spacers 37, 37 and the electrode plates 35, 36 on another substrate; and bonding these substrates.

Alternatively, using a three-layered substrate such as a SOI (silicon on insulator) substrate, the above turnable mirror can be manufactured by a variety of methods such as by etching and forming the frame 31, the reflection plate 32, and the link sections 33, 34 of the turnable mirror 30 on the upper substrate; etching and forming the spacers 37 on the lower substrate; and bonding the electrode plates 35, 36 manufactured in accordance with another step.

Figure 4A:
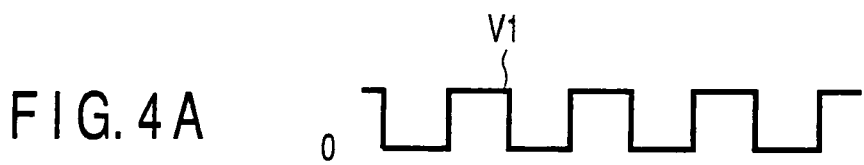
FIGS. 4A, 4B and 4C are views each showing a relationship between a drive signal and a wavelength change of the external cavity resonator type tunable light source shown in FIG. 1.
Figure 4B:
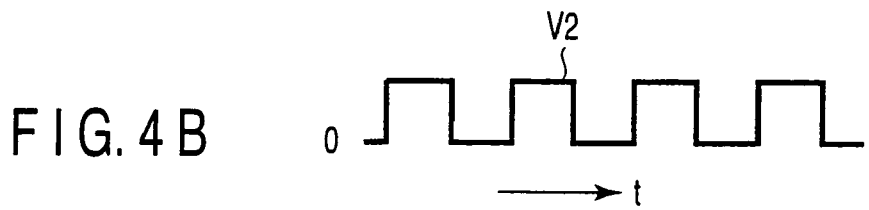

A drive unit 40 shown in FIG. 2 applies signals V1, V2 whose phase are shifted by 180 degrees each other as shown in FIGS. 4A and 4B to two electrode plates 35, 36 while the frame 31 of the turnable mirror 30 is used as a reference electric potential. Then, the drive unit generates an electrostatic attractive force alternately between the electrode plates 35, 36 and an end part of the reflection plate 32, and reciprocally turns the reflection plate 32.

The frequency of the signals V1, V2 are set so as to be equal to the resonance frequency of the reflection plate 32 which is determined depending on the shape and weight of the reflection plate 32 of the turnable mirror and the torsional spring constant of the link sections 33, 34 so that the reflection plate 32 can be reciprocally turned at a large angle with a small amount of drive power.

Figure 4C:
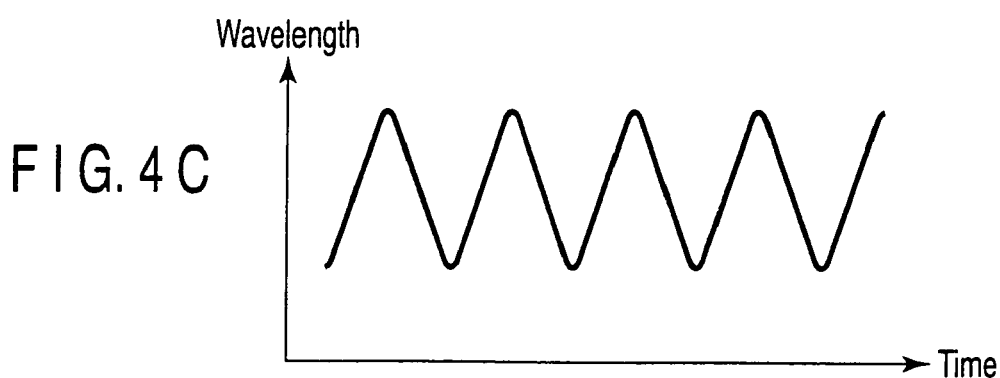

By reciprocal turning of the reflection plate 32, an angle of the mirror surface 32a changes with respect to the resonator length of the external cavity resonator and the diffraction face 25a, and the wavelength of laser light beams emitted from the semiconductor laser 22 continuously and periodically changes as shown in FIG. 4C.

However, like the external cavity resonator type tunable light source 20, in the case of a structure of turning the reflection plate 32 itself on which the mirror surface 32a is formed on one face side thereof, its turning center does not exist on a line connecting the center of the link sections 33, 34, i.e., its turning center exists inside of the reflection plate 32 and does not exist on a plane extending the mirror surface 32a. Thus, strictly, it is possible to consider a circumstance in which a wavelength is prevented from continuously varying without generating mode hopping because a condition for the conventional Littman type external cavity resonator type tunable light source described previously is not met.

Therefore, in the tunable light source 20 according to the present embodiment, a wavelength is continuously varied by applying a technique disclosed in patent document 3 (Japanese Patent No. 3069643).

That is, in the above-described patent document 3, in a virtual allocation in which laser light beams pass through the reflection plate 32 without using the stationary mirror 24 as indicated by the dotted line of FIG. 5, assume that a plane extending the diffraction face 25a of the diffraction grating 25 is defined as H1; a plane extending the effective end facet of the resonator 22a considering a refractive index inside of the semiconductor laser 22 and a collimator lens is defined as H2; a plane extending the mirror surface 32a of the reflection plate 32 is defined as H3; and the plane H1 and the plane H3 cross each other at a position between the turning center of the mirror surface 32a and the diffraction grating. In this case, a relationship of $r=(L1-L2)/\sin \alpha$ is established when a distance from a turning center O to a predetermined incident position G of the diffraction grating 25 is defined as "r"; an effective optical path length from the predetermined incident position G to the effective end facet of the resonator 22a is defined as L1; a distance from the turning center O to the plane H3 is defined as L2; and an incidence angle of light beam with respect to the diffraction grating 25 is define as $\alpha$, whereby a wavelength can be continuously varied without generating mode hopping.

As in the present embodiment, in the case where an optical path from the semiconductor laser 22 to the diffraction grating 25 is bent via the stationary mirror 24, the effective optical path length L1 from the predetermined incident position or point G to the effective end facet of the resonator 22a is expressed by a sum between the optical path length L3 from the effective end facet of the resonator 22a to the stationary mirror 24 and the optical path length L4 from the stationary mirror 24 to the predetermined incident position G.

Therefore, as in the present embodiment, in the case of the semiconductor laser 22, each section is set so as to establish the following formula, thereby enabling continuous wavelength sweeping without mode hopping, as shown in FIG. 4C.

$$r=(L3+L4-L2)/\sin \alpha$$

In addition, as in the present embodiment, in the case of the semiconductor laser 22, there is provided an allocation in which light beams are made incident to the diffraction grating 25 via the stationary mirror 24 so as not to make the reflection plate 32 and the optical path cross each other. Thus, there is no need for providing a hole for light transmission or the like on the reflection plate 32 itself, a deformation due to its degradation of rigidity does not occur, and stable, high speed wavelength sweeping can be carried out even on a thin plate.

As described above, in the external cavity resonator type tunable light source 20 according to the present embodiment, the stationary mirror 24 is allocated in a space sandwiched between the plane extending the mirror surface 32a of the reflection plate 32 and the plane extending the diffraction face 25a in the turning center direction and between the turning center and the predetermined incident position of the diffraction face 25a. From among the two spaces partitioned by the plane extending the reflection face 32a of the reflection plate 32 of the turnable mirror 30, the semiconductor laser 22 and the collimator lens 23 are allocated in a space in which the diffraction grating 25 is included. Then, from the semiconductor laser 22, light beams are made incident to the stationary mirror 24 via the collimator lens 23, and its reflected light is made incident to the predetermined position of the diffraction face 25a of the diffraction grating 25.

Therefore, the turnable mirror can be configured with a very simple structure in which the reflection plate 32 itself having the mirror surface 32a is reciprocally turned regardless of the optical path, and wavelength varying can be carried out at a high speed and with high precision.

Further, in the above-described embodiment, although the reflection plate 32 has been formed symmetrically on the left and right with respect to the link sections 33, 34 so that one end side of the link sections is used as a light reflection section, and an external force is received at the other end side, the shape of the reflection plate and the mode of applying the external force is not limited to the above embodiment.

Figure 6:
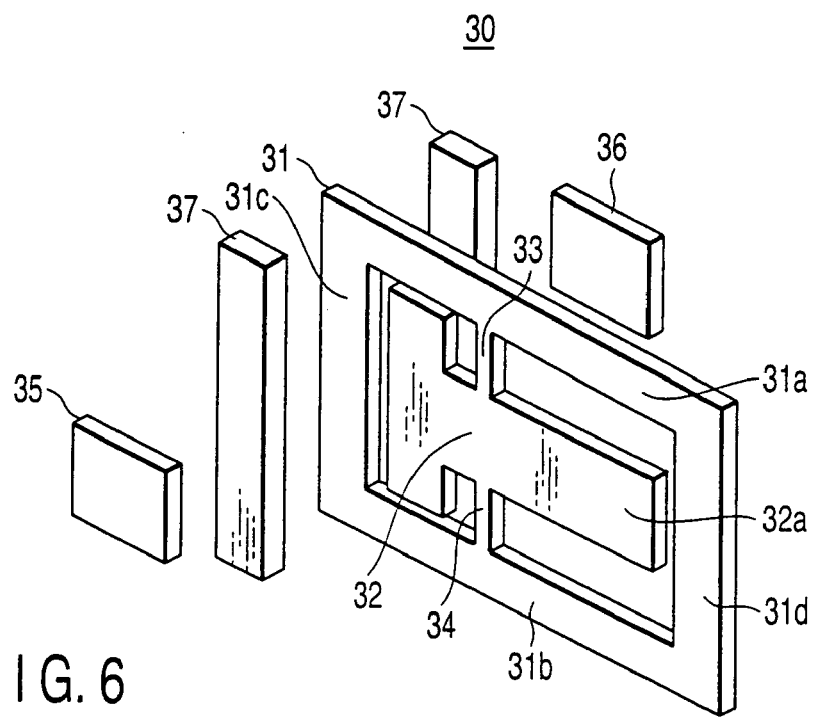
FIG. 6 is a view showing a modified example of the essential portions of the external cavity resonator type tunable light source according to the present invention.

For example, as in the reflection plate 32 of the turnable mirror 30 shown in FIG. 6, the length in the transverse direction at the other end side for receiving the external force is determined to be shorter than that on one end side; and its width (length in the longitudinal direction) is increased, whereby the left and right rotation moment may be balanced. In this case, the side width of the entire turnable mirror 30 can be reduced.

Figure 7:
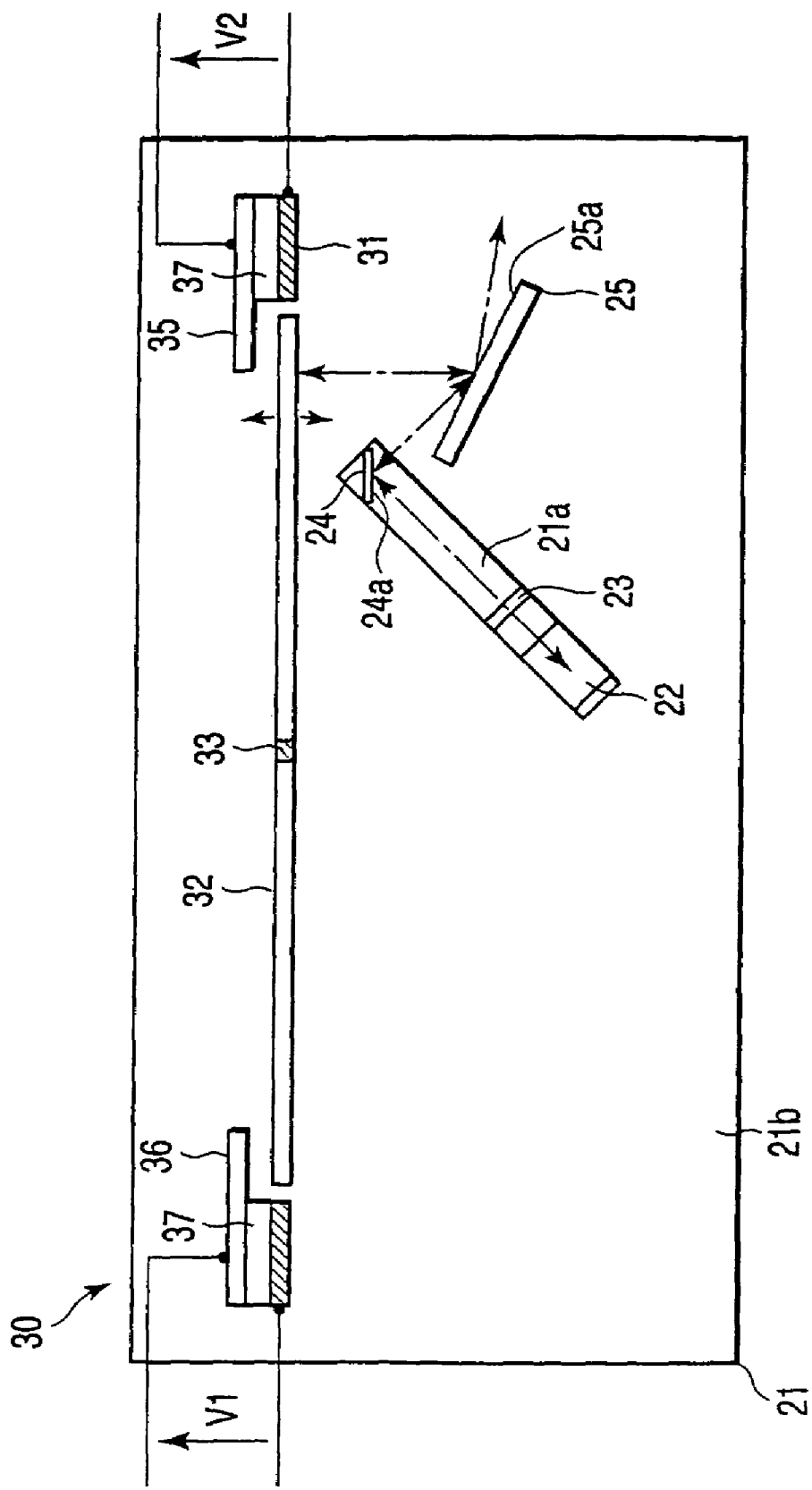
FIG. 7 is a plan view showing a modified example of the allocation of the external cavity resonator type tunable light source according to the present invention.

Although the above embodiments has described a case in which the external force is periodically applied to one end side of the reflection plate 32, thereby reciprocally turning the reflection plate, the external force can be applied at any arbitrary position. For example, as shown in FIG. 7, the electrode plates 35, 36 are allocated at both ends of the rear face side of the reflection plate 32, and the signals V1, V2 are applied, respectively, thereby making it possible to reciprocally turn the reflection plate 32 in the same manner as that described above.

Moreover, the electrode plates 35 can be formed in an arbitrary shape, and may be formed in a sink comb shape other than the flat shape described previously.

In addition, the external force can be electromagnetically applied by using a combination of a coil and a magnetic plate or a combination of a magnet and a coil as well as the electrostatic force described previously.

Figure 17:
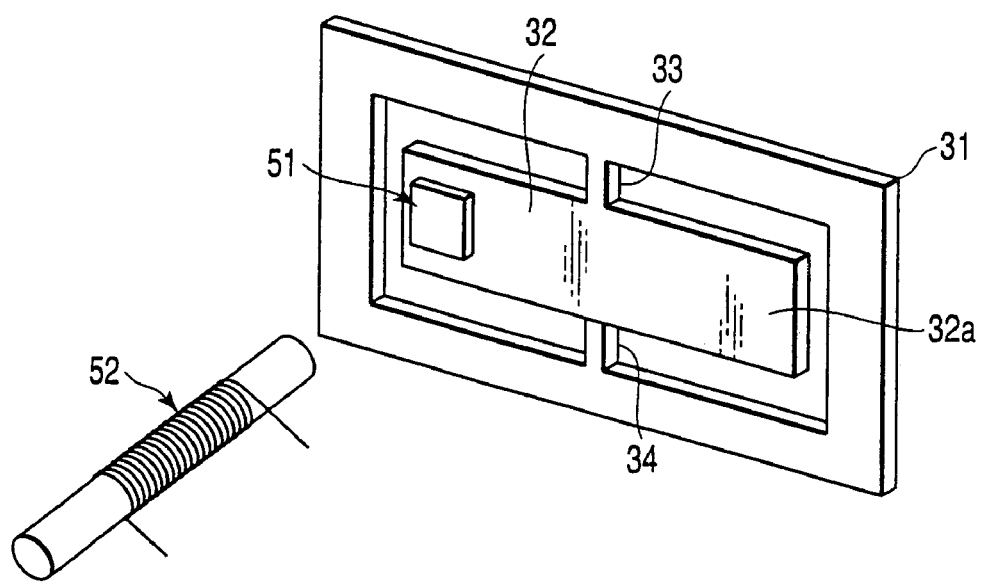
FIG. 17 is a perspective view showing a modified example of the essential portions of the external cavity resonator type tunable light source according to the present invention.

For example, as shown in FIG. 17, a magnetic plate or a magnet 51 is allocated on the reflection plate 32, and a solenoid coil 52 is allocated near the magnetic plate or magnet 51, a driving force for torsional vibration is applied to the reflection plate 32 thereby to flow a predetermined current to the solenoid coil 52. Thus, the reflection plate 32 can be reciprocally turned in the same manner as that described above.

However, in this case, although, as a distance of the solenoid coil 52 is allocated more closely, the driving force is increased more significantly, the amplitude of the torsional vibration of the reflection plate 32 is also increased concurrently, thus making it necessary to regulate the distance of the solenoid coil 52 or the predetermined current flows to the solenoid coil 52, so that the solenoid coil 52 and magnetic body or magnet 51 do not contact each other.

FIG. 18A shows a half-wave current in a cycle which is equal to a resonance frequency of the reflection plate 32 supplied to the solenoid coil 52 in the case where the magnetic plate 51 is allocated on the reflection plate 32.

FIG. 18B shows a full-wave current in a cycle which is equal to a resonance frequency of the reflection plate 32 supplied to the solenoid coil 52 in the case where the magnet 51 is allocated on the reflection plate 32.

Further, the use of an ultrasonic vibrator applies ultrasonic vibration with a frequency equal to the resonance frequency of the reflection plate 32 to the base 21, thereby making it possible to reciprocally turn the reflection plate 32 at the resonance frequency.

In the case where an external force other than the electrostatic external force is thus applied, there is no need for providing a turnable mirror 30 made of an electrically conductive material.

In the above embodiment, the mirror surface 24a of the stationary mirror 24 is constructed to be in parallel to the diffraction groove 25b of the diffraction grating 25 so that an optical path from the semiconductor laser 22 to the reflection plate 32 through the collimator lens 23, the stationary mirror 24, and the diffraction grating 25 is on the same plane.

However, this construction does not limit the present invention. The semiconductor laser 22 and the collimator lens 23 can be allocated at arbitrary positions in a space in which the diffraction grating 25 is included, from among the two spaces partitioned on a plane extending the reflection face 32a of the reflection plate 32, and the direction of the mirror surface 24a of the stationary mirror 24 may be determined in accordance with such arbitrary positions.

Figure 8:
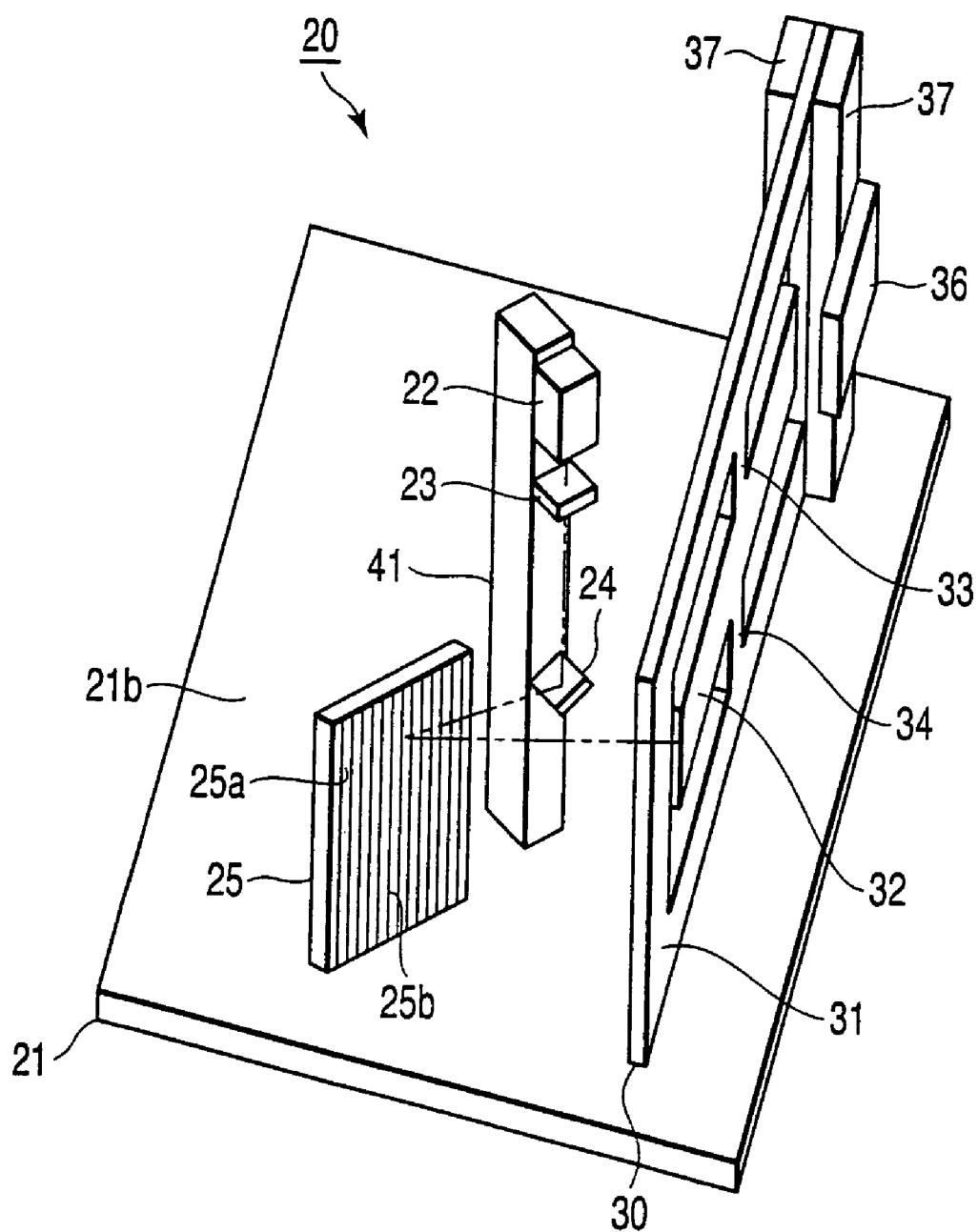
FIG. 8 is a perspective view showing a modified example of allocation of the external cavity resonator type tunable light source according to the present invention.

For example, as shown in FIG. 8, the semiconductor laser 22 and the collimator lens 23 may be allocated to be vertically arranged with respect to the base 21 so that their optical axes are in parallel to the diffraction groove 25a of the diffraction grating 25. The light beams from the collimator lens 23 may be made incident to the diffraction face 25a of the diffraction grating 25 after they have been received by the stationary mirror 24 having the mirror surface 24a which forms an angle of 45 degrees with respect to the top face of the base 21.

The semiconductor laser 22, the collimator lens 23, and the stationary mirror 24 are supported by a support member 41.

Also, although the above embodiment shows a structure in which the diffraction grating 25 and the turnable mirror 30 are stood on the base 21 for the purpose of clear understanding of allocation of each section, these sections including the semiconductor laser 22, the collimator lens 23, and the stationary mirror 24 are supported in an arbitrary mode.

Figure 9:
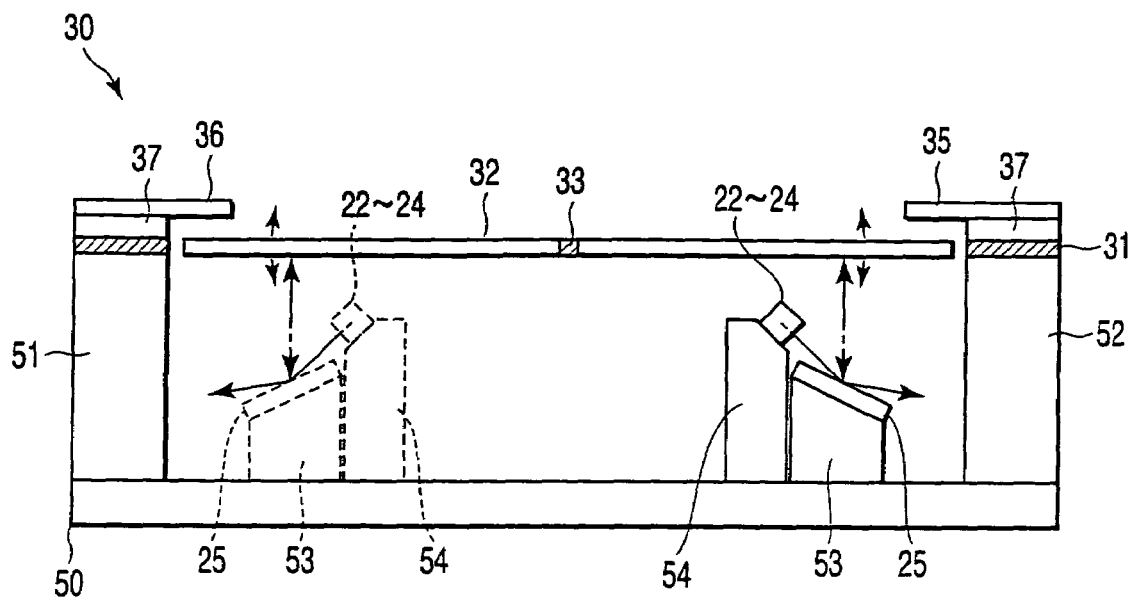
FIG. 9 is a plan view showing a modified example of the allocation portions of the external cavity resonator type tunable light source according to the present invention.
Figure 10:
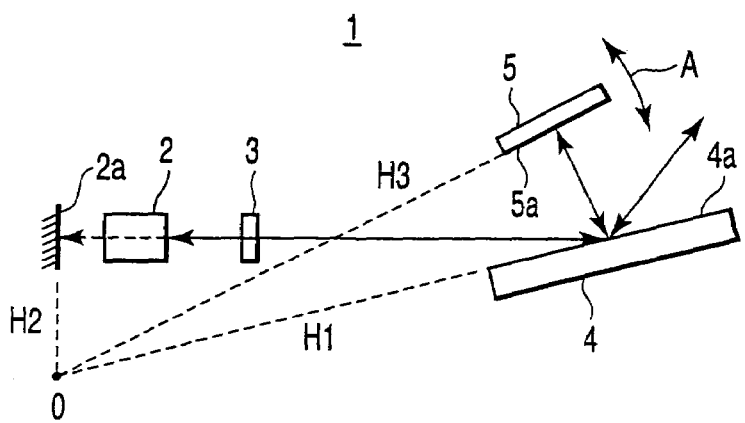
FIG. 10 is a plan view showing a basic construction of an external cavity resonator tunable light source according to a prior art.
Figure 11:
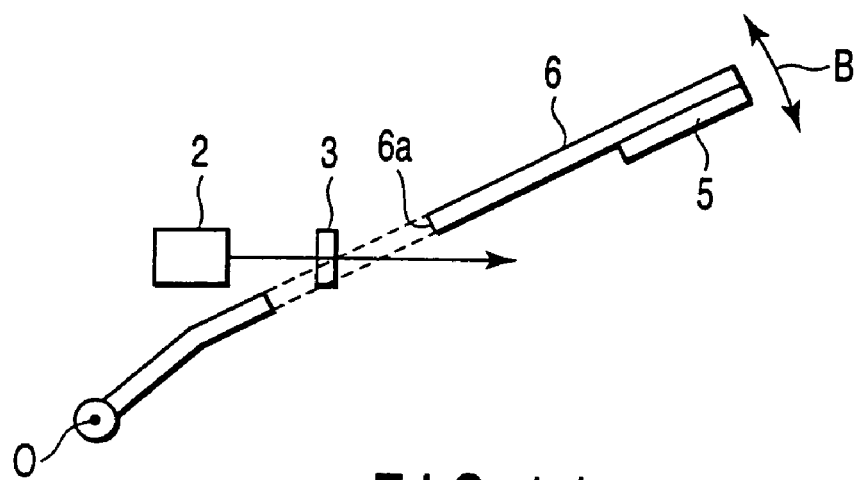
FIG. 11 is a plan view showing an example of a construction of essential portions of an external cavity resonator type tunable light source according a first prior art.
Figure 12:
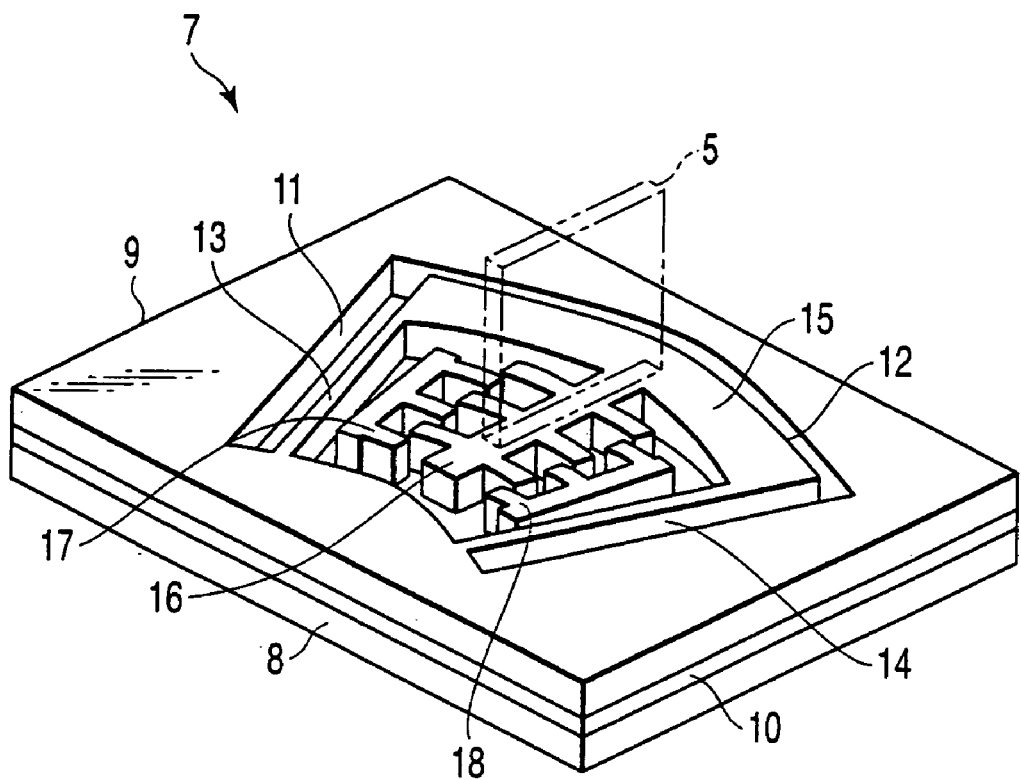
FIG. 12 is a perspective view showing an example of a construction of essential portions of an external cavity resonator type tunable light source according a second prior art.
Figure 16:
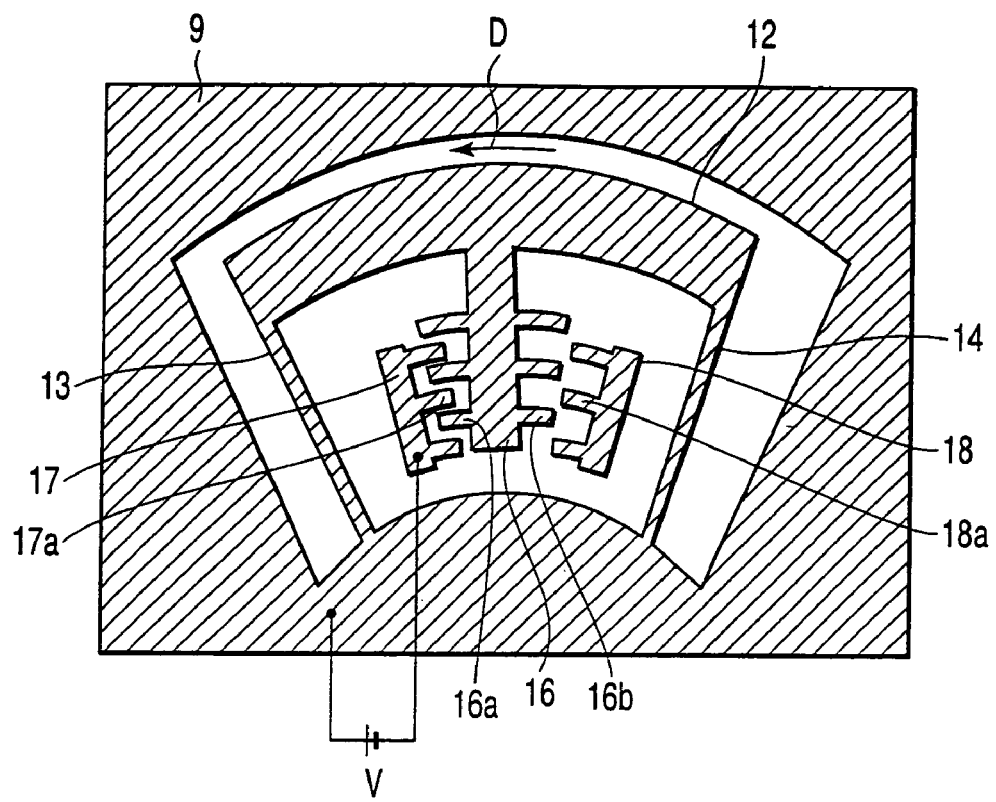
FIG. 16 is a plan view illustrating an operation of the external cavity resonator type tunable light source according to the second prior art.

For example, as shown in FIG. 9, the frame 31 of the turnable mirror 30 is supported by support members 51, 52 stood at both ends of the top part of a flat substrate 50; the diffraction grating 25 is supported by a support member 53 stood on the top part of the substrate 50; and further, the semiconductor laser 22, the collimator lens 23, and the stationary mirror 24 are supported by a support member 54 stood in the vicinity of the support member 53, thereby making it possible to configure the allocation shown in FIG. 8 described previously. The support members 53, 54 may be integrated with each other.

As indicated by the dotted line of FIG. 9, at the other end side of the reflection plate 32, the semiconductor laser 22, the collimator lens 23, and the stationary mirror 24, and the diffraction grating 25 are supported by the support members 53, 54, thereby making it possible to configure an allocation or arrangement so that the wavelength swept light beams can be emitted in a dual system manner.

In this case, by determining a dual system wavelength sweeping range to identical to another range, a two-channel tunable light source can be provided. By changing the dual system wavelength sweeping range, a tunable light having a broader bandwidth can be provided.

Although not shown, on the opposite face side of the reflection plate 32, the semiconductor laser 22, the collimator lens 23, and the stationary mirror 24 are disposed in one or two sets, and the number of light emission systems is further increased, thereby making it possible to configure a multi-channeled, broader-bandwidth tunable light source.

The multi-channeling or broader-bandwidth of the tunable light source described above is an advantageous effect attained with a structure in which an optical path does not cross the turnable mirror and by collectively allocating the semiconductor laser 22, the collimator lens 23, and the stationary lens 24 as well as the diffraction grating 25 on one face side of the reflection plate 32.

Now, an application or its related matter, of the tunable light source according to the present invention, will be described here.

In the case of measuring light wavelength dependency such as an optical device, there is frequently used a method for making light beams incident to an element targeted to be measured while changing a light wavelength by using a tunable light source with an elapse of time, and then measuring the transmitted light, reflection light and the like by a photo detector.

In this case, as long as the optical device characteristics is changed according to light wavelength due to an external factor, such a change can be recognized by using the above technique. Thus, such an optical device can be used as a sensor.

As such one example, a fiber brag grating (FBG) sensor is known. When a distortion is applied to the FBG sensor itself, the wavelength of the light reflected changes according to such distortion quantity. Therefore, the FBG sensor is installed in a structure such as a bridge, a tunnel, or a building, and is used as a sensor for detecting these deformations.

In development of a new material, the FBG sensor is also used as means for checking deformation or fatigue of such a new material against a load.

The tunable light source is also used for evaluating whether or not the light wavelength dependency of an optical device for use in optical communication meets a standard.

As described above, the tunable light source is used in a variety of fields as means for recognizing how an object responds to each light wavelength. The above measurement speed is determined depending on a light wavelength sweeping speed of the tunable light source. However, in the current tunable light source, it becomes difficult to make stable, high speed light wavelength control.

The tunable light source according to the present invention is an important technique for providing a downsized, inexpensive tunable light source as well as stable, high speed light wavelength control.

Therefore, as has been described above in detail, according to the present invention, there can be provided an external cavity resonator type light source which can be easily manufactured and which can vary a wavelength at a high speed by solving the problems associated with the prior arts and simplifying a mirror support structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An external cavity resonator type tunable light source comprising:

a base;

a semiconductor laser, which is fixed to the base, and at least one light emission facet of which has low reflectance facet;

a collimator lens which is fixed to the base and converts light emitted from the low reflectance facet of the semiconductor laser into a parallel light beam;

a diffraction grating which is fixed vertically to the base and receives and diffracts the light beam from the collimator lens at a predetermined incident position on and at a predetermined incident angle to a diffraction face on which a plurality of diffraction grooves are provided in a direction perpendicular to the base;

a turnable mirror which is fixed vertically to the base and has a mirror surface positioned opposite the diffraction face of the diffraction grating, the mirror surface being arranged to receive a diffracted light beam from the diffraction grating, make the received light beam incident to the diffraction face of the diffraction grating again in a reverse optical path, and return the incident light beam to the semiconductor laser, and which is formed so as to enable the reflection face to be reciprocally turned at a predetermined angle range and around an axis defined as a turning center, which is parallel to the diffraction groove and is on a plane extending from the diffraction face of the diffraction grating, wherein a resonator length determined depending on an optical path length from an effective end facet of the resonator to the turnable mirror surface via the diffraction grating is changed by turning the turnable mirror surface to sweep a wavelength of the emitted light from the semiconductor laser; and a stationary mirror which is fixed to the base and arranged so as to make the light beam emitted from the semiconductor laser via the collimator lens incident from a predetermined direction to a predetermined position of the diffraction grating at the side of the mirror surface of a virtual plane extending from the turnable mirror surface and at the side of the diffraction face of a virtual plane extending from the diffraction face of the diffraction grating, wherein the semiconductor laser and the collimator lens are arranged at the side of the mirror surface of the virtual plane extending from the mirror surface of the turnable mirror, wherein the semiconductor laser and the collimator lens are arranged at the side of the mirror surface of a virtual plane extending from the turnable mirror surface, and an optical path length from the effective end facet of the resonator to the collimator lens, the stationary mirror, the predetermined position of the diffraction grating, and the turnable mirror surface is substantially equal to the resonator length, wherein the turnable mirror comprises:

a frame to which MEMS are applied and which is formed of a silicon substrate;

a reflection plate which is allocated inside of the frame and which has the mirror surface formed at least at one face side thereof;

a pair of link sections which extend so as to be arranged on one straight line from edge portions of the frame, opposed to each other, to outer edges of the reflection plate to link between the frame and the reflection plate, the link sections being torsionally deformable along a lengthwise direction thereof;

drive means for applying an external force to the reflection plate to cause the reflection plate to turn in the predetermined angle range around a line connecting centers of the pair of link sections defined as the turning center, wherein the reflection plate of the turnable mirror reduces a length in a transverse direction at the other end side and increase a width corresponding to a length in a vertical direction thereof to ensure that left and right rotation moments are well balanced, and wherein a relationship $r=(L3+L4-L2)/\sin \alpha$ is established among: a distance "r" from the turning center to the predetermined incidence position of the diffraction face of the diffraction grating; a distance L2 from the turning center to the plane extending the mirror surface: an optical path length L3 from the effective end facet of the resonator to the stationary mirror; an optical path length L4 from the stationary mirror to the predetermined incident position of the diffraction face of the diffraction grating; and a light incidence angle $\alpha$ from the stationary mirror to the diffraction face of the diffraction grating.

2. An external cavity resonator type tunable light source according to claim 1, wherein the drive means apply an external force in a cycle which corresponds to a resonance frequency of the reflection plate of the turnable mirror to cause the reflection plate to be reciprocated at the resonance frequency.

3. An external cavity resonator type tunable light source according to claim 1, wherein the drive means include means for generating an electrostatic driving force as an external force applied to the reflection plate.

4. An external cavity resonator type tunable light source according to claim 1, wherein the drive means each include two electrode plates mounted via an insulating spacer on one or both of a pair of side plates of the frame in order to apply an external force to the reflection plate in an electrostatic manner.

5. An external cavity resonator type tunable light source according to claim 4, wherein the drive means each include means for applying signals V1, V2 whose phase are shifted by 180 degrees each other with respect to the two electrode plates while the frame is defined as a reference electric potential, and alternately generating an electrostatic attractive force between the two electrode plates and the end portion of the reflection plate, thereby causing the reflection plate to reciprocally turn.

6. An external cavity resonator type tunable light source according to claim 5, wherein a frequency of the signals V2 is set so as to be substantially equal to the resonance frequency of the reflection plate which is mainly determined depending on a shape and a weight of the reflection plate of the turnable mirror and a torsional spring constant of the pair of link sections.

7. An external cavity resonator type tunable light source according to claim 1, wherein the drive means each include means for electromagnetically applying an external force as an external force applied to the reflection plate.

8. An external cavity resonator type tunable light source according to claim 7, wherein the means for electromagnetically applying an external force each include a combination of a magnetic plate fixed to the reflection plate and a coil which acts an electromagnetic force to the magnetic plate.

9. An external cavity resonator type tunable light source according to claim 7, wherein the means for electromagnetically applying an external force each include a combination of a magnet fixed to the reflection plate and a coil which acts an electromagnetic force to the magnet.

10. An external cavity resonator type tunable light source according to claim 8, wherein the drive means each include means for applying a half wave current in a cycle which is substantially equal to the resonance frequency of the reflection plate to the coil.

11. An external cavity resonator type tunable light source according to claim 9, wherein the drive means each include means for applying a full wave current in a cycle which is substantially equal to the resonance frequency of the reflection plate to the coil.

12. An external cavity resonator type tunable light source according to claim 1, wherein a configuration is provided so that the stationary mirror surface is in parallel to the diffraction groove of the diffraction grating and an optical path from the semiconductor laser to the reflection plate through the collimator lens, the stationary mirror, and the diffraction grating is on an identical plane.

13. An external cavity resonator type tunable light source according to claim 1, wherein the semiconductor laser and the collimator lens are allocated at an arbitrary position in a space in which the diffraction grating is included, from among two spaces partitioned by a plane extending the reflection face of the reflection plate, and a direction of the stationary mirror surface is set in accordance with the allocation position of the semiconductor laser and the collimator lens.

* * * * *